United States Patent [19]

Frass et al.

[11] Patent Number: 5,116,720

[45] Date of Patent: May 26, 1992

[54] DEVELOPING SOLVENT FOR LAYERS WHICH ARE CROSSLINKABLE BY PHOTOPOLYMERIZATION AND PROCESS FOR THE PRODUCTION OF RELIEF FORMS

[75] Inventors: Werner Frass; Hans-Joachim Schlosser; Guenther Schoen, all of Wiesbaden, Fed. Rep. of Germany

[73] Assignee: Hoechst Aktiengesellschaft, Frankfurt am Main, Fed. Rep. of Germany

[21] Appl. No.: 426,412

[22] Filed: Oct. 25, 1989

[30] Foreign Application Priority Data

Oct. 26, 1988 [DE] Fed. Rep. of Germany ....... 3836404

[51] Int. Cl.$^5$ .............................................. G03F 7/32
[52] U.S. Cl. .................................... 430/331; 430/285; 430/288; 430/306
[58] Field of Search ............... 430/325, 330, 331, 328, 430/288; 252/364; 585/11, 3, 10; 568/630, 632, 658

[56] References Cited

U.S. PATENT DOCUMENTS

| | | | |
|---|---|---|---|
| 2,606,935 | 8/1952 | Martin | 524/375 |
| 4,186,006 | 1/1980 | Kobayashi et al. | 430/331 |
| 4,423,135 | 12/1983 | Chen et al. | 430/271 |
| 4,623,611 | 11/1986 | West | 430/329 |
| 4,786,580 | 11/1988 | Hsich et al. | 430/331 |
| 4,806,452 | 2/1989 | Hoffmann et al. | 430/306 |
| 4,820,621 | 4/1989 | Tanka et al. | 430/331 |
| 4,886,927 | 12/1989 | Anshel et al. | 430/331 |
| 4,908,298 | 3/1990 | Hefferon et al. | 430/328 |
| 4,939,070 | 7/1990 | Brumsvold et al. | 430/325 |

FOREIGN PATENT DOCUMENTS 0188230 7/1986 European Pat. Off. .

OTHER PUBLICATIONS

Grant & Hackh's Chemical Dictionary 5th Ed pp. 439, 441.
Arthur and Elizabeth Rose: The Condensed Chemical Dictionary, Fifth Edition p. 89, Column I.
Patent Abstracts of Japan, vol. 13, p. 355 (P-914) [3703], JP-A-1 114 846 Japan Synthetic Rubber Co. Aug. 5, 1989.
Patent Abstracts of Japan, vol. 5, p. 161 (P-84) [833], Oct. 16 1981, JP-A-56 91 232 (Nippon Denki K.K.) Jul. 24, 1981.

Primary Examiner—Charles L. Bowers, Jr.
Assistant Examiner—John S. Chu
Attorney, Agent, or Firm—Foley & Lardner

[57] ABSTRACT

The invention describes a developing solvent for layers which are crosslinkable by photopolymerization and contain a binder based on an elastomeric polymer, a photopolymerizable monomer compatible therewith and a photoinitiator. The developing solvent comprises a phenol ether of the general formula I

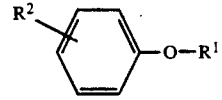

wherein
$R^1$ denotes $(C_1-C_6)$n-alkyl or iso-alkyl, cycloalkyl or $(C_6-C_{12})$-aryl and
$R^2$ denotes hydrogen, $(C_1-C_6)$n-alkyl or iso-alkyl or $-OR^1$, and a relatively high-boiling alcohol.

Compared with solvents of the prior art, the developing solvent of the present invention is non-toxic, can quickly be removed from the layer and has a high capacity for layer components.

14 Claims, No Drawings

DEVELOPING SOLVENT FOR LAYERS WHICH ARE CROSSLINKABLE BY PHOTOPOLYMERIZATION AND PROCESS FOR THE PRODUCTION OF RELIEF FORMS

BACKGROUND OF THE INVENTION

The invention relates to a developing solvent for layers which are crosslinkable by photopolymerization and contain a binder based on an elastomeric polymer, a photopolymerizable monomer compatible therewith and a photoinitiator.

It has long been known to produce relief forms, in particular flexographic printing plates, by means of photopolymerization-crosslinkable layers which are exposed imagewise and thereafter developed and washed out.

For the production of these forms, the photopolymer layer is exposed imagewise to actinic light; a relief can then be formed by washing off the non-exposed and thus non-crosslinked portions of the layer, using a developing solvent. The developing solvent should dissolve the non-crosslinked portions of the layer as quickly as possible, and the solvent must be removable with greatest possible ease from the crosslinked portions of the layer, so that the plate is rapidly dried.

For this reason, low-boiling developing solvents presently are generally used.

Examples of preferred solvents which are described in DE-A 22 15 090 include methyl ethyl ketone, benzene, toluene, xylene, carbon tetrachloride, trichloroethane, trichloroethylene, methyl chloroform and tetrachloroethane, and mixtures of these. It is a disadvantage of the above-indicated chlorinated hydrocarbons that they are toxic and give rise to disposal problems. If chlorinated hydrocarbons are used as developing solvents, the portions of the layer which are to be removed swell very strongly while still on the plate and as the concentration of dissolved components of the non-crosslinked layer portions increases in the developing solvent, viscosity of the solvent rises sharply. As a result, the capacity of the developing solvent is very limited and the solvent is rendered useless, at a solids content of 5. A further consequence of the strong increase in viscosity is that plates develop very slowly even at less than 5% solids content.

Of the non-chlorinated hydrocarbons specified in DE-A 22 15 090 benzene, toluene and xylene are mentioned. These solvents have the disadvantage of being easily flammable and, moreover, they lead to severe swelling of the layer and, consequently, to slow developing and drying of the plate.

Additionally, due to their low flash-point, these solvents cannot be used in developing apparatuses which are not explosion-proof.

DE-A 36 00 116 describes relatively highly boiling developing solvents which contain hydrocarbons, alcohols or ketones which are branched, or cyclic with one or three olefinic double bonds, or saturated, or cycloaliphatic with one to three olefinic double bonds. Monoterpenes are mentioned in particular. Limonene which is used in the example may have good developing characteristics, but is sensitive to oxygen and irritates the skin, properties which should not be present in a developing solvent. It is also a disadvantage of limonene that it permits only very slow development and is difficult to remove from the layer. It is also impossible to develop plates which contain nitrile rubber as the elastomer.

SUMMARY OF THE INVENTION

It is therefore an object of the present invention to provide a developing solvent for photopolymer layers, which -is non-toxic,
has a high flash-point,
can be removed from the layer as completely and quickly as possible, without giving rise to swelling of the layer and
shows the smallest possible increase in viscosity when taking up components of the layer, so that it is possible to develop quickly and faultlessly, irrespective of high capacity requirements and
makes it possible to develop plates containing nitrile rubber as the elastomer.

It is also an object of this invention to provide a process for the production of photopolymerization-crosslinked relief forms which employs the developing solvent according to the present invention.

In accomplishing these objects there has been provided a developing solvent comprising a phenol ether of the general formula I

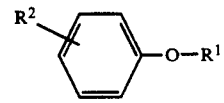

wherein
$R^1$ denotes $(C_1-C_6)$n-alkyl or iso-alkyl, cycloalkyl or $(C_6-C_{12})$-aryl and
$R^2$ denotes hydrogen, $(C_1-C_6)$n-alkyl or iso-alkyl or $-OR^1$.

Further objects, features and advantages of the present invention will become apparent from the detailed description of preferred embodiments that follows.

DETAILED DESCRIPTION OF THE PREFERRED EMBODIMENTS

Preference is given to developing solvents which contain a phenol ether of the general formula (I)

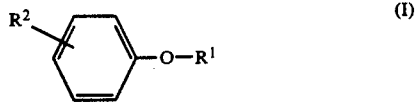

wherein
$R^1$ denotes $(C_1-C_6)$n-alkyl or iso-alkyl, and cycloalkyl or $(C_6-C_{12})$-aryl and
$R^2$ denotes hydrogen, $(C_1-C_6)$n-alkyl or iso-alkyl or $-OR^1$.

Particularly preferred are developing solvents, in which
$R^1$ denotes $(C_1-C_4)$n-alkyl or iso-alkyl and
$R^2$ denotes hydrogen, $(C_1-C_3)$n-alkyl or $-OR^1$.

Preference is, in particular, given to compounds of the formula I, in which
$R^1$ denotes $(C_1-C_3)$n-alkyl or iso-alkyl, if $R^2$=hydrogen, $(C_1-C_2)$n-alkyl, if $R^2=(C_1-C_2)$n-alkyl, and methyl, if $R^2=-OR^1$ with $R^1$ then being $(C_1-C_3)$n-alkyl.

In the case of $R^2$ being other than hydrogen, the ortho and meta positions are preferred, if $R^2$ denotes —OR$^1$ and the ortho, meta and para positions are preferred, if R$^2$ denotes (C$_1$-C$_3$) alkyl.

The following are particularly preferred compounds:

Methyl phenyl ether, ethyl phenyl ether, isopropyl phenyl ether, propyl phenyl ether, o-cresyl methyl ether, m-cresyl methyl ether, p-cresyl methyl ether, resorcinol dimethyl ether and pyrocatechol ethylene ether.

The developing solvent of the present invention may contain a single phenol ether or a mixture of phenol ethers.

The developing solvent according to the invention comprises from about 55 to 100% by weight, particularly from 55 to 90% by weight, of phenol ether.

Apart from these compounds, the developing solvent of this invention may contain other solvents as additions, particularly if the polymer layer carries an additional polyamide-containing protective layer. In this event, alcohols, especially relatively highly boiling alcohols, are preferred for use as additional solvents.

The principal constituents of the photopolymerization-crosslinkable layers which are to be developed using the developing solvent of the present invention comprise a binder based on an elastomeric polymer, a photopolymerizable monomer which is compatible with the binder, and a photoinitiator. The layers may also comprise various other binders, monomers or photoinitiators.

Additions which may be contained in the layers include dyes, pigments, anti-halation agents, antioxidants, plasticizers, antiozonants, crosslinking agents, regulators, fillers, levelling agents and other agents which improve the action of the layers.

Further auxiliary agents which may be added to the above-described layer are, for example, inhibitors to prevent thermal polymerization, such as hydroquinone and its derivatives, 2,6-di-tert.-butyl-p-cresol, nitrophenols, nitrosamines, such as N-nitrosodiphenylamine, or salts of N-nitrosocyclohexylhydroxylamine, e.g., the alkali metal or aluminum salts thereof.

Particularly preferred layers which are crosslinkable by photopolymerization are those which contain binders comprising polymers of conjugated aliphatic dienes, the monomer units of which have 4 to 5 carbon atoms. Among these the following are particularly mentioned: natural rubber, homopolymers of butadiene and isoprene, copolymers of butadiene and isoprene, copolymers of butadiene and/or isoprene with other monomers, such as styrene, vinyl toluene, acrylonitrile, or (meth)acrylic alkyl esters, for example, nitrile rubbers according to EP-A 064 564, random copolymers of styrene/butadiene, styrene/isoprene, and styrene/isoprene/butadiene, or block polymers of styrene monomers and butadiene and/or isoprene having a styrene content of 10 to 50% by weight. Elastomers of this kind are described in DE-B 22 15 090, DE-A 24 56 439, DE-A 29 42 183, and DE-A 21 38 582.

The layers which are crosslinkable by photopolymerization generally contain from about 20 to 95% by weight, preferably from about 30 to 95% by weight, of binder.

Preferred monomers having one or more polymerizable olefinic double bonds are, in particular, esters and amides of acrylic and methacrylic acid. Examples are the compatible mono and diacrylates and mono and dimethacrylates of monohydric or polyhydric alcohols, such as ethylene glycol, di-, tri-, tetra- or polyethylene glycols, the latter preferably having from about 10 to 15 ethylene glycol units, 1,3-propane diol, hexane diol, dodecane diol, glycerol, 1,1,1-trimethylol propane, 1,2,4-butanetriol, or pentaerythritol, for example, ethylene glycol monomethacrylate, 1,3-propanediol monomethacrylate, glycerol mono or diacrylate, 1,2,4-butanetriol monomethacrylate, pentaerythritol triacrylate, polyethylene glycol methyl ether acrylate, tetradecaethylene glycol dimethacrylate or the triether of glycerol and 3 mols of N-methylol acrylamide or methacrylamide, hexanediol diacrylate, hexanediol dimethacrylate, 2-ethylhexylacrylate, lauryl methacrylate, stearyl methacrylate. The amount of monomers contained in the layer is, in general, from about 1 to 70% by weight, preferably from about 2 to 50% by weight, of the nonvolatile constituents of the composition.

Photoinitiators which can be used are the known compounds which exhibit sufficient thermal stability in the processing of recording materials and which form a sufficient number of free radicals, when exposing and thereby initiating polymerization of the monomers. The photoinitiators should absorb light in the wavelength region from about 250 to about 500 nm, forming radicals in the process. Examples of preferred photoinitiators are acyloins and the derivatives thereof, such as benzoin, benzoin alkylethers, for example, benzoin isopropyl ether, vicinal diketones and the derivatives thereof, for example, benzil, benzil acetals such as benzil dimethyl ketal, fluorenones, thioxanthones, polynuclear quinones, acridines and quinoxalines; and also trichloromethyl-s-triazines, 2-halomethyl-4-vinyl-1,3,4-oxadiazole derivatives, halogen-containing oxazoles substituted by trichloromethyl groups, carbonyl methylene heterocycles containing trihalomethyl groups, according to DE-A 33 33 450, acyl phosphine oxide compounds as described, for example, in DE-A 31 33 419 and other phosphorus-containing photoinitiators, for example, the 6-acyl-(6H)-dibenz-[c,e][1,2]-oxaphosphorin-6-oxides, in particular 6-(2,4,6-trimethylbenzoyl)-(6H)-dibenz-[c,e][1,2]-oxaphosphorin-6-oxide described in German patent application P 38 27 735.2. The photoinitiators can also be used in combination with one another or with coinitiators or activators, respectively, for example, with Michler's ketone and its derivatives or with 2-alkyl anthraquinones. The amount of photoinitiator is, in general, from about 0.01 to 10% by weight, preferably from about 0.5 to 5% by weight, of the layer.

The compositions which are crosslinkable by photopolymerization can be used for the preparation of relief and flexographic printing plates by way of casting from a solution or extruding and calendering to form layers having a thickness of about 0.02 to 10 mm, preferably about 0.2 to 6 mm. The layer can be laminated to the surface of an appropriate support or a solution of the composition can be applied to a layer support.

The above-indicated layers are not only used for the production of relief printing plates, but also for the production of, for example, planographic printing plates, gravure cylinders, screen printing stencils, and photoresists.

Depending on the intended application, suitable supports comprise, for example, polyester films, steel or aluminum sheets, copper cylinders, supports for screen printing stencils, foam layers, rubber-elastic supports, or circuit boards. It may also be advantageous to apply a covering or protective layer, for example, a thin layer of polyvinyl alcohol or polyamide, or a peelable covering film, for example, of polyethylene terephthalate, to the photosensitive recording layer. Moreover, precoating of the support may be advantageous. The additional layer between the support and the photosensitive layer may act, for example, as an anti-halation layer or as an adhesive layer.

The invention also relates to a process for the production of photopolymerization-crosslinked relief forms. In the process, the layers which are crosslinkable by photopolymerization are imagewise exposed to the actinic light of light sources such as mercury vapor lamps or fluorescent tubes, the emitted wavelength ranging between about 230 and 450 nm, preferably between about 300 and 420 nm. The non-exposed and thus non-crosslinked portions of the layer are removed with the aid of the developing solvent according to the present invention, by spraying, washing or brushing. The developed relief forms are appropriately dried at temperatures up to about 120° C. and may be post-exposed to actinic light, either simultaneously or subsequently.

The photopolymerization-crosslinked relief forms according to the invention are advantageously used in the production of printing forms, especially letterpress and relief printing forms, which are particularly suitable for flexographic printing. The invention is explained by the examples below.

EXAMPLE 1

A commercial flexographic printing plate based on a styrene-isoprene-styrene three-block polymer ((R)Cyrel HL) as an elastomer having a layer thickness of 2.8 mm was first subjected to overall exposure from the back for 76 seconds, using a commercial fluorescent-tube exposure apparatus and thereafter exposed imagewise from the front for 12 minutes, through a negative transparency placed in contact with it. The plate exposed in this manner was then developed in a commercial developing apparatus equipped with brushes, using methyl phenyl ether containing 15% by weight butanol. The developing time to achieve optimum results was 5 minutes.

The flexographic printing form was thereafter dried for 2 hours at 60° C. and stored for 15 hours at room temperature. Following a conventional post-treatment with an aqueous bromine solution, a flexographic printing form of excellent quality was obtained.

EXAMPLE 2

A commercial flexographic printing plate as indicated in Example 1 (diameter of plate 30 mm) was placed in 50 ml of methyl phenyl ether, after peeling off the covering layer. The plate was then wiped and dried for 1 hour at 50° C. After drying and storing for 18 hours, an increase in weight of the plate of 1.3% was determined, which resulted from non-evaporated developing solvent.

EXAMPLE 3

The procedure of Example 2 was followed, with the exception that ethyl phenyl ether was used as the developing solvent. The increase in weight was 1.5%.

EXAMPLE 4

Comparative Example

The procedure of Example 2 was followed, with the exception that xylene was used as the developing solvent. The increase in weight was 1.92%.

EXAMPLE 5

Comparative Example

A flexographic printing plate was exposed and developed according to Example 2 but, in this case, limonene was used as the developing solvent. The increase in weight was 1.92%.

EXAMPLE 6

To determine the capability (capacity) of developing solvents to take up components from non-crosslinked regions of a flexographic printing plate ((R)Cyrel HL), the viscosities of different developing solvents were determined at different solids contents produced by components from the layer after developing a plate comprising a styrene, isoprene-styrene three-block copolymer as the elastomer.

Table 1 shows the viscosity values determined in an Ubbelohde viscometer at 25° C., for solids contents of 5, 7.5 and 10% by weight. Although the developing solvent of the present invention still exhibits a viscosity which allows a very high developing speed even at a solids content of 7.5% by weight, viscosity of perchloroethylene at a solids content of only 5% by weight in the developing solvent already so high that rapid development is no longer ensured.

TABLE 1

| Developing Solvent | Viscosities [cSt] at Different Solids Contents [% by weight] | | |
|---|---|---|---|
| | 5 | 7.5 | 10 |
| methyl phenyl ether | 14.4 | 38.69 | 91.73 |
| perchloroethylene | 37.1 | 120.8 | 333.5 |

EXAMPLE 7

A commercial flexographic printing plate based on nitrile rubber ((R)Cyrel LP), which is suitable for printing with mineral sil-based links, was developed as in Example 1. The developing time to obtain optimum results was 15 minutes. After drying, a flexographic printing plate of excellent quality resulted.

What is claimed is:

1. A developing solvent for layers which are crosslinkable by photopolymerization and include a binder base don an elastomeric polymer, a photopolymerizable monomer compatible therewith and a photoinitiator, said developing solvent comprising a mixture of:
   (a) about 55 to 90% by weight of at least one phenol ether represented by the general formula I

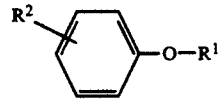

wherein
   $R^1$ denotes $(C_1-C_6)$n-alkyl or iso-alkyl, cycloalkyl or $(C_6-C_{12})$-aryl and
   $R^2$ denotes hydrogen, $(C_1-C_6)$n-alkyl or iso-alkyl or $-OR^1$; and
   (b) a relatively high-boiling alcohol.

2. The developing solvent as recited in claim 1, wherein said phenol ether comprises methyl phenyl ether and said alcohol comprises butanol.

3. The developing solvent as recited in claim 1, wherein $R^1$ is $(C_1-C_3)$n-alkyl or iso-alkyl when $R^2$ is hydrogen, $R^1$ is $(C_1-C_2)$n-alkyl when $R^2$ is $(C_1-C_2)$n-alkyl, and $R^1$ is methyl when $R^2$ is $-OR^1$ in which $R^1$ is $(C_1-C_3)$n-alkyl.

4. The developing solvent as recited in claim 3, wherein $R^2$ is $-O-R^1$ and $R^2$ is in the ortho or meta position relative to $-O-R^1$.

5. The developing solvent as recited in claim 3, wherein the phenol ether is selected from the group consisting of methyl phenyl ether, ethyl phenyl ether, isopropyl phenyl ether, propyl phenyl ether, o-cresyl methyl ether, m-cresyl methyl ether, p-cresyl methyl ether, resorcinol dimethyl ether and pyrocatechol ethylene ether.

6. The developing solvent as recited in claim 1, wherein the developing solvent contains a single phenol ether.

7. The developing solvent as recited in claim 1, wherein the developing solvent contains a mixture of phenol ethers.

8. The developing solvent as recited in claim 1, wherein the phenol ether is methyl phenyl ether.

9. The developing solvent as recited in claim 1, wherein the alcohol is butanol.

10. A developing solvent as claimed in claim 1, wherein the solvent consists essentially of a mixture of the phenol ether represented by the general formula I and the relatively high-boiling alcohol.

11. The developing solvent as recited in claim 10, wherein the phenol ether is selected from the group consisting of methyl phenyl ether, ethyl phenyl ether, isopropyl phenyl ether, propyl phenyl ether, o-cresyl methyl ether, m-cresyl methyl ether, p-cresyl methyl ether, resorcinol dimethyl ether and pyrocatechol ethylene ether.

12. A developing solvent as claimed in claim 10, wherein the phenol ether is methyl phenyl ether.

13. A developing solvent as claimed in claim 12, wherein the relatively high-boiling alcohol is butanol.

14. A developing solvent as claimed in claim 11, wherein the relatively high-boiling alcohol is butanol.

* * * * *